(12) United States Patent
Chou et al.

(10) Patent No.: US 7,719,096 B2
(45) Date of Patent: May 18, 2010

(54) SEMICONDUCTOR DEVICE AND METHOD FOR MANUFACTURING A SEMICONDUCTOR DEVICE

(75) Inventors: Ta-Te Chou, Taipei (TW); Xiong-Jie Zhang, Tianjin (CN); Xian Li, Tianjin (CN); Hai Fu, Tianjin (CN); Yong-Qi Tian, Tianjin (CN)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

(21) Appl. No.: 11/827,041

(22) Filed: Jul. 9, 2007

(65) Prior Publication Data

US 2008/0036072 A1 Feb. 14, 2008

Related U.S. Application Data

(60) Provisional application No. 60/837,329, filed on Aug. 11, 2006.

(51) Int. Cl.
*H01L 23/495* (2006.01)

(52) U.S. Cl. ............... 257/675; 257/698; 257/720; 257/723; 257/734; 257/796; 257/E23.067; 257/E23.19

(58) Field of Classification Search ............... 219/505; 257/676, 778, 666, 675, 678–733, 796, 734, 257/E23.067, E23.19
See application file for complete search history.

(56) References Cited

U.S. PATENT DOCUMENTS

| | | | |
|---|---|---|---|
| 5,174,941 A | 12/1992 | Sorensen | |
| 5,326,243 A | 7/1994 | Fierkens | |
| 6,019,037 A | 2/2000 | Larson | |
| 6,054,760 A * | 4/2000 | Martinez-Tovar et al. | ... 257/692 |
| 6,428,300 B2 | 8/2002 | Lajza, Jr. et al. | |
| 6,498,394 B1 * | 12/2002 | Fehr | ............... 257/706 |
| 6,624,522 B2 | 9/2003 | Standing et al. | ............. 257/782 |
| 6,784,540 B2 | 8/2004 | Cardwell | ............. 257/722 |
| 6,791,172 B2 | 9/2004 | Chen et al. | ............. 257/678 |
| 6,943,061 B1 | 9/2005 | Sirinorakul et al. | |
| RE38,961 E | 1/2006 | Okuno et al. | |

(Continued)

FOREIGN PATENT DOCUMENTS

JP 6-21317 * 1/1994 ............. 257/676

OTHER PUBLICATIONS

International Rectifier DirectFET, http://www.irf.com/product-info/hexfet/directfet.htm, 2 pages, copyright 1995-2005.

(Continued)

*Primary Examiner*—Jasmine J Clark
(74) *Attorney, Agent, or Firm*—Mayer & Williams PC; Stuart H. Mayer; Karin L. Williams

(57) ABSTRACT

A semiconductor device mountable to a substrate is provided. The device includes a semiconductor die and an electrically conductive attachment region having a first attachment surface and a second attachment surface. The first attachment surface is arranged for electrical communication with the semiconductor die. An interlayer material is formed on the second attachment surface of the electrically conductive attachment region. The interlayer material is a thermally conductive, dielectric material. A housing at least in part encloses the semiconductor die and the interlayer material.

18 Claims, 5 Drawing Sheets

U.S. PATENT DOCUMENTS

| | | | |
|---|---|---|---|
| 6,992,001 B1 | 1/2006 | Lin | |
| 7,088,004 B2 | 8/2006 | Standing | |
| 7,449,774 B1* | 11/2008 | Jeun et al. | 257/712 |
| 2003/0207516 A1* | 11/2003 | Tan et al. | 438/200 |
| 2006/0091563 A1* | 5/2006 | Arai et al. | 257/778 |
| 2007/0013053 A1 | 1/2007 | Chou et al. | 257/706 |

OTHER PUBLICATIONS

International Rectifier DirectFET™ Mosfet Packaging, http://www.irf.com/product-info/hexfet/dfpackaging.html, 2 pages, copyright 1995-2005.

* cited by examiner

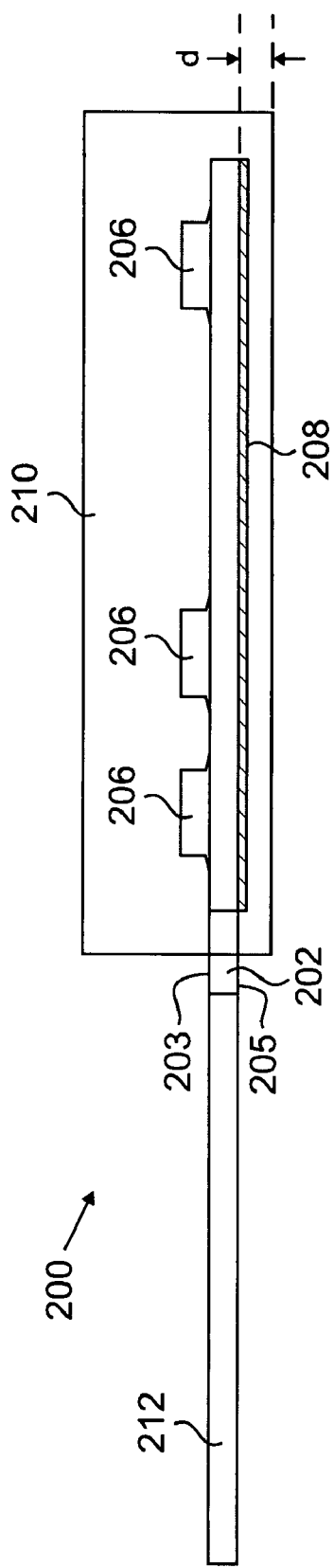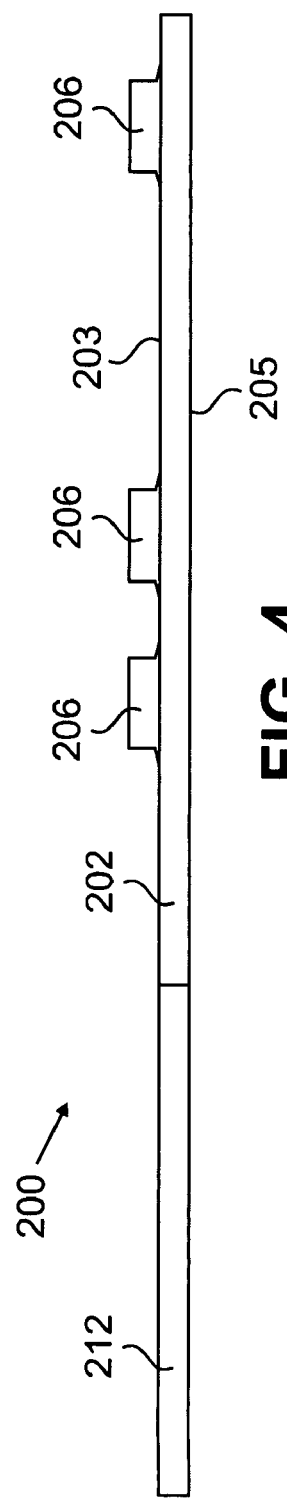

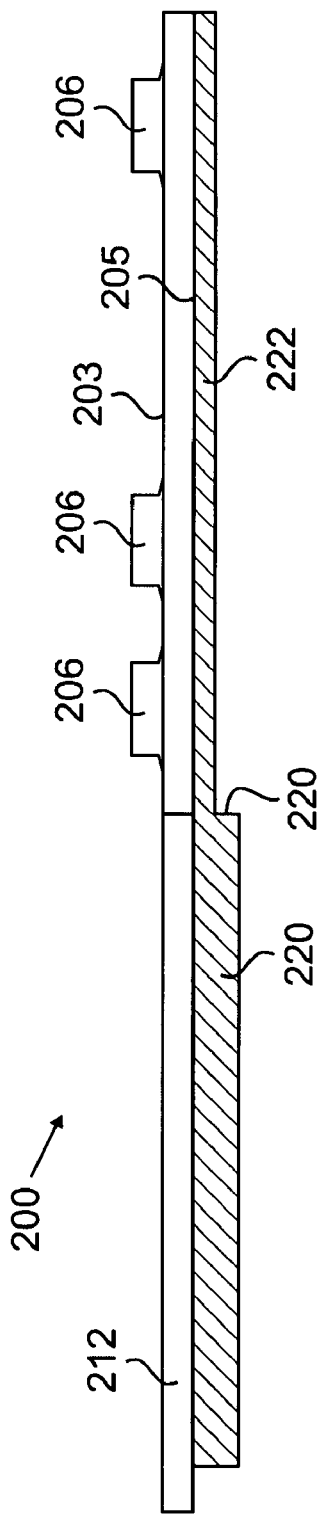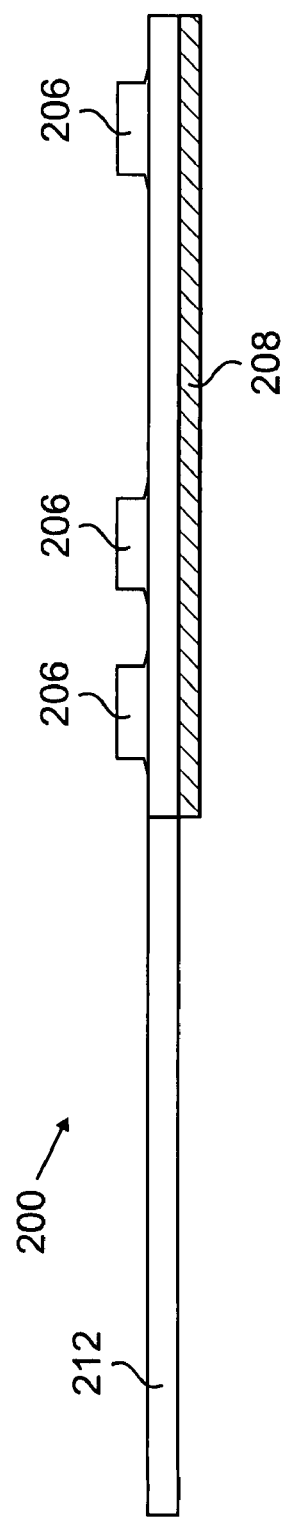

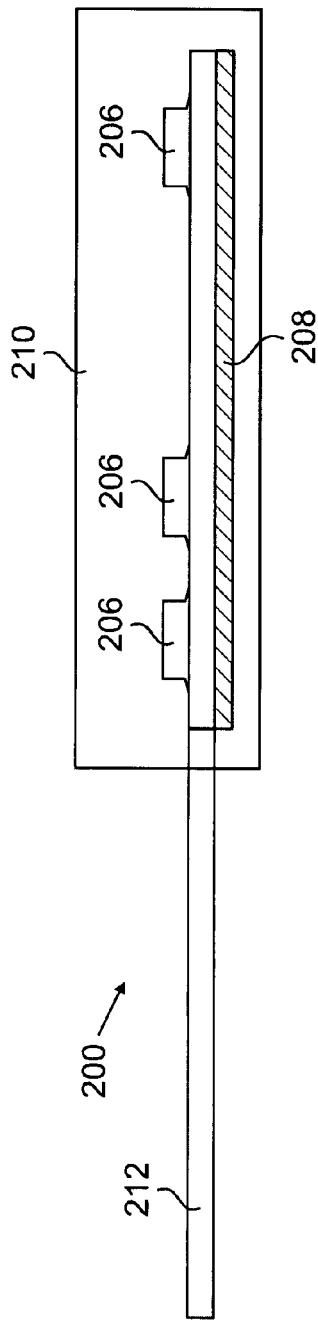
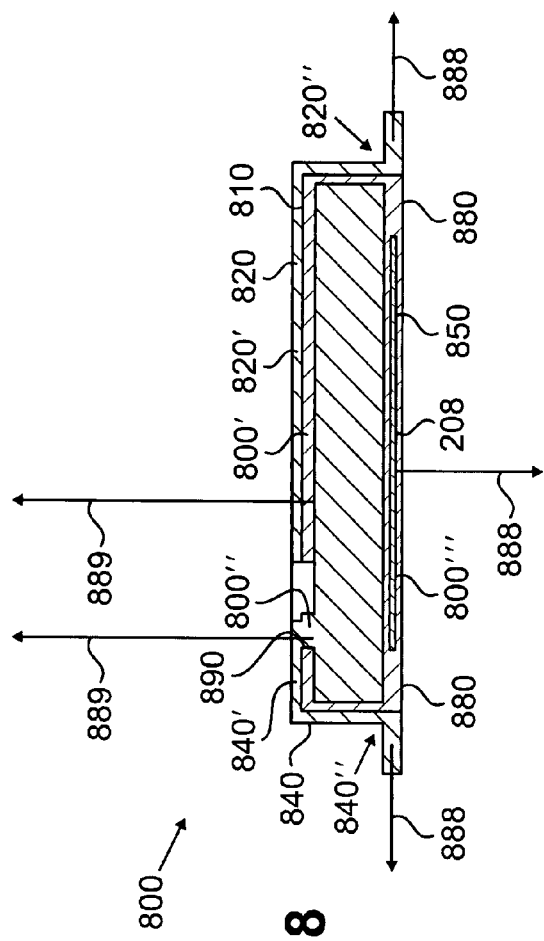

SEMICONDUCTOR DEVICE AND METHOD FOR MANUFACTURING A SEMICONDUCTOR DEVICE

STATEMENT OF RELATED APPLICATIONS

This application claims the benefit of U.S. Provisional Patent Application Ser. No. 60/837,329, filed Aug. 11, 2006, entitled "Method of Fabricating Power Bridge by Coating Lead Frame with High Dielectric Strength and High Thermal Conductivity Material".

This application is also related to U.S. patent application Ser. No. 11/827,042, filed on Jul. 9, 2007, and entitled "Semiconductor Device and Method for Manufacturing a Semiconductor Device Having Improved Head Dissipation Capabilities".

This application is also related to U.S. patent application Ser. No. 11/179,334, filed on Jul. 12, 2005, and entitled "Semiconductor Device and Method for Manufacturing a Semiconductor Device".

Each of the related applications above is incorporated herein by reference in its entirety.

FIELD OF THE INVENTION

Aspects of this invention relate generally to a semiconductor device and to a method for manufacturing a semiconductor device, and more particularly to a semiconductor device encapsulated in a housing having a reduced thickness.

BACKGROUND OF THE INVENTION

Semiconductor devices must be protected against moisture as well as assembly process and other environmental contaminants. This is commonly done by encapsulating the device in a mold compound, such as a thermosetting plastic, applied by a transfer molding process.

In a typical transfer molding machine used in the semiconductors industry, a thin electronic workpiece mounted on a lead frame is clamped between two halves of a split mold. The mold defines a mold cavity around the device with sufficient clearance to allow mold compound to be injected and flow around the device to encapsulate it. During the molding process mold compound is injected into an inlet and air inside the mold escapes from a vent. A plunger drives the liquefied mold compound into the mold cavity. The mold compound is allowed cure and the mold is opened, releasing the encapsulated semiconductor device.

Because smaller semiconductor devices are highly desirable, device manufacturers would like to reduce the thickness of the encapsulating layer of mold compound which encases each device. Thinner encapsulating layers also aid in improving device performance or reliability with regard to heat dissipation, resistance to coating damage under thermal stress and other parameters. However, as the distance between the inner mold surfaces and the electronic workpiece is decreased, it becomes more difficult to obtain a high quality void-free encapsulant around the entire device.

To obtain a void-free seal, the liquefied mold compound must enter the mold inlet and entirely fill the space in the mold cavity before the mold compound flow front arrives at the mold vent. If the mold compound reaches the vent before the mold is completely filled, an air bubble is trapped in the mold, creating a void.

To completely fill the mold cavity, the mold compound must flow between the upper mold surface and the upper surface of the device, between the lower mold surface and the lower surface of the device, and into the space surrounding the outer perimeter of the device. However, as the distance between the upper and lower mold surfaces and the device is reduced, so as to make the encapsulating coating thinner, it becomes more difficult for the mold compound to penetrate these regions.

If this distance is reduced too far, the mold compound will flow around the outer perimeter of the device before the mold compound flow front has displaced the air in the space above and below the device. The result is a void in the encapsulation material as an air bubble is pinched off in the center of the device.

As a result, transfer molding of semiconductor devices with conventional equipment has required that the distance from the inner mold surfaces to the device be at least about 200-250 micrometers. This ensures that there will be laminar flow of the molding compound into the mold and around the device. The exact minimum distance limit is, of course, a function of the specific mold compound used, the fillers it contains and process parameters, such as temperature, but, in general, reducing the distance from the inner mold surfaces to the device to less than some minimum distance results in unacceptable manufacturing losses due to the formation of voids.

FIGS. 1 and 2 are perspective and cross-sectional views of a Vishay® Semiconductor brand single phase inline bridge rectifier device 100 having multiple semiconductor dies 106 inside, manufactured by Vishay Intertechnology, Inc. Device 100 is through-hole mountable via leads 112, and includes an exterior epoxy housing 110 that protects the semiconductor dies 106—during operation of device 100, heat generated by the semiconductor dies 106 is transferred through leads 112 and housing 110. The thermal conductivity of epoxy housing 110 often results in device 100 having poor thermal dissipation performance. A major cause of reduced efficiency in semiconductor devices such as rectifiers is inadequate cooling during normal operation. Unfortunately, as discussed above, if the thickness of the housing is reduced to achieve better thermal conduction, molding failures such as IPE or voids 130 (see FIG. 2) tend to increase, leading to problems such as a failure of a high-potential (hipot) test or electric strength test, which is caused by a breakdown in insulation.

SUMMARY OF THE INVENTION

In accordance with the present invention, a semiconductor device mountable to a substrate is provided. The device includes a semiconductor die and an electrically conductive attachment region having a first attachment surface and a second attachment surface. The first attachment surface is arranged for electrical communication with the semiconductor die. An interlayer material is formed on the second attachment surface of the electrically conductive attachment region. The interlayer material is a thermally conductive, dielectric material. A housing at least in part encloses the semiconductor die and the interlayer material.

In accordance with one aspect of the invention, the semiconductor device comprises a power semiconductor device.

In accordance with another aspect of the invention, the power semiconductor device comprises a rectifier.

In accordance with another aspect of the invention, the rectifier comprises a bridge rectifier.

In accordance with another aspect of the invention, the semiconductor device comprises a surface-mountable device.

In accordance with another aspect of the invention, the semiconductor device comprises a through-hole-mountable device.

In accordance with another aspect of the invention, the semiconductor device comprises an integrated circuit.

In accordance with another aspect of the invention, the integrated circuit comprises a chip-scale package.

In accordance with another aspect of the invention, the electrically conductive attachment region comprises one of a copper pad, a solder ball, a lead, a lead frame, and a lead frame terminal.

In accordance with another aspect of the invention, the interlayer material is a thermally conductive adhesive.

In accordance with another aspect of the invention, the interlayer material comprises a screen printed layer.

In accordance with another aspect of the invention, the housing comprises a molding compound.

In accordance with another aspect of the invention, a method is provided of manufacturing a semiconductor device mountable to a substrate. The method begins by arranging a semiconductor die for electrical communication with a first attachment area of an electrically conductive attachment region. A dielectric, thermally conductive interlayer material is applied to a second attachment area of the electrically conductive attachment region; A housing is provided that at least in part encloses the die and the interface material.

BRIEF DESCRIPTION OF THE DRAWINGS

FIG. 3 is a cross-sectional view of the packaging for a through-hole mountable semiconductor device constructed in accordance one aspect of the present invention.

FIGS. 4-7 show cross-sectional views of the through-hole mountable semiconductor device shown in FIG. 3 during the fabrication process.

FIG. 8 is a cross-sectional view of the packaging for a surface-mountable semiconductor device in accordance with other aspects of the present invention.

DETAILED DESCRIPTION

Figure 1:
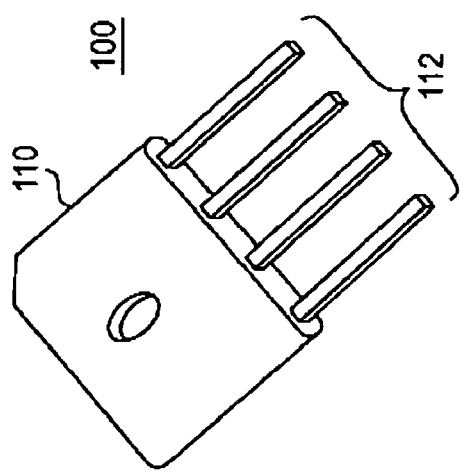
FIGS. 1 and 2 are perspective and cross-sectional views, respectively, of the packaging for a conventional through-hole mountable semiconductor device.
Figure 2:
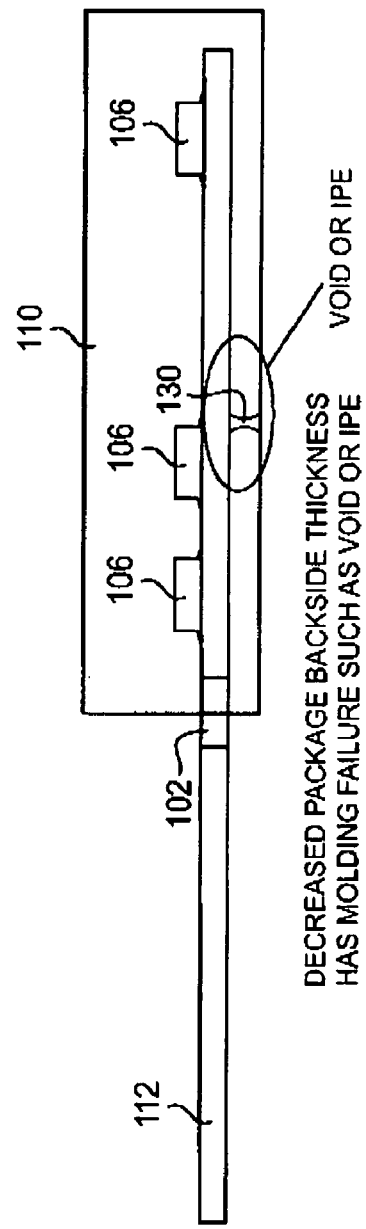

FIG. 3 is a side view of an interior cross-section of a through-hole mountable semiconductor device 200 in accordance with certain aspects of the present invention. For exemplary purposes, semiconductor device 200 has a similar footprint and die arrangement as through-hole mountable semiconductor device 100 (shown in FIG. 1), although device 200 may have different exterior dimensions or geometries altogether. Semiconductor device 200 may be a power semiconductor device, such as a rectifier or another type of integrated circuit.

Electrically conductive attachment regions 202, such as copper pads, solder balls, leads, lead frames, or lead frame terminals, each have one surface 203 arranged to provide electrical communication with a semiconductor die 206 (three dies are visible, although only one die is referenced for exemplary purposes.) Die 206 may be, for example, a diode, a MOSFET, or another type of die/integrated circuit. Surface 203 may be attached to die 206 in any suitable manner, such as by soldering. Through-hole mountable leads 212 (one visible) may also be in electrical communication with semiconductor die 206 and/or electrically conductive attachment region 202. Another surface 205 of electrically conductive attachment region 202 is coated with an interlayer material 208 that has a high dielectric constant and a high thermal conductivity. One example of suitable material is a thermally conductive silicone elastomer material. For instance, The interlayer material 208 may be a commercially available thermally conductive adhesive such as SE4486 and SE4450 manufactured by DOW CORNING, 282 manufactured by Emerson&Cuming, and SA2000 manufactured by BERGQUIST.

A housing 210 at least in part encloses die 206 and electrically conductive attachment regions 202. Housing 210 may be a molding compound, such as a plastic, molded to thermally conductive element 202 and/or interlayer material 206. Housing 410 may be formed in any desired configuration/shape by a variety of well-known methods, such as overmolding or injection molding. As shown, housing 210 is approximately 3.5 mm thick with a configuration similar to portions of exterior housing 110 of semiconductor device 100 (shown in FIG. 1).

By using interlayer material 208 the thickness d of the housing extending from the surface of the electrically conductive attachment region 202 can be advantageously reduced while still avoiding deleterious effects caused to the semiconductor device 200 by IPE (Internal Parts Exposure) or voids. In some cases the housing thickness d can be reduced by 50% or more. For instance, the housing thickness d may be reduced from 1.0 mm to 0.5 mm in thickness. In particular, the semiconductor device 200 can avoid hipot test failures even with such a reduction in housing thickness. The interlayer material 208 effectively acts as a shield providing a high dielectric strength during a hipot test while also allowing good thermal conduction because of its high thermal conductivity.

In some embodiments of the invention the interlayer material 208 is coated or applied to the electrically conductive attachment region 202 using a screen printing process. Screen printing techniques have been widely used in the graphic arts fields to produce art work and have found use in the production of printed circuit boards to transfer relatively large scale mask patterns onto printed circuit boards. Screen printing techniques include the use of a stencil to selectively transfer an image onto a substrate. The image is typically transferred by mechanically pressing a given material through porous (e.g., mesh) portions of the stencil onto a substrate while adjacent non-porous portions of the stencil do not permit printing of the material. Screen printed materials of use in the production of graphic art work include paints and/or inks, while materials of use in the transfer of mask patterns in circuit board production include masking materials. Stencils for use in screen printing are often created by laser milling an image onto a stencil or by photo development processes wherein an image is photo transferred to an undeveloped stencil and the stencil is subsequently developed to reveal the image. An undeveloped stencil typically includes a screen that is coated with a non-porous material. Upon development, portions of the non-porous material are removed yielding porous section of the stencil or yielding apertures in the stencil in the configuration of a photo transferred image. As the image is in effect transferred to the developed stencil, the stencil is then of use to transfer the same image to a substrate as discussed above. The techniques of screen printing and the use of stencils in such printing are well known and therefore, will not be discussed in any greater detail.

FIG. 4 is a side view of an interior cross-section of a through-hole mountable semiconductor device 200 showing a stencil 220 that is applied to the surface 205 of electrically conductive attachment region 202. The stencil 860 includes a solid section 220 (also referred to herein as a non-porous section) and a porous screen section 222 (or alternatively an aperture section without a screen section). During the printing step, the solid section 220 of the stencil prevents the printing of the paste onto select portions of lead frame 208 and electrically conductive attachment region 202 and the porous section 222 permits the printing of the paste onto select portions of electrically conductive attachment region 202. During the printing step, the paste may be mechanically pressed through the porous section of the stencil by a variety of techniques, such as squeegeeing the paste or rolling the paste with a roller. According to some embodiments, stencils of different thicknesses are used to print pastes of corresponding different thicknesses That is, relatively thin paste layers may be screen printed with a relatively thin stencil. Relatively thin paste layers are of use, for example, on integrated circuit having relatively fine interconnect pad pitch.

FIG. 6 shows the interlayer material 208 after it has been applied to the electrically conductive attachment region 202. If necessary, the interlayer material 209 may undergo a curing processing at an elevated temperature to harden the material.

Next, in FIG. 7 the housing 210 is formed in any suitable encapsulation process such as a molding process.

Thus semiconductor devices have been described that include enhanced heat removal paths created by reducing the thickness of the housing that encapsulates the die or dies. Conducting heat away from mounting substrates is desirable in product designs that feature increased component densities, and thus increased heat flux densities, on each substrate—cooling provided for the substrate, which generally results in a single operating temperature being provided for a relatively large surface area, is supplemented by the electrically isolated semiconductor device package itself. Semiconductor devices may operate at more desirable temperatures without significant alterations in their footprints, and/or without additional isolation requirements, reducing the need for product re-designs.

Aspects of the present invention described above with respect to through-hole mountable semiconductor devices are also applicable to surface-mountable semiconductor devices. FIG. 8 is a front view of an interior cross-section of a surface-mountable semiconductor device (a chip-scale device, for example) that includes an interlayer material 208 such as shown in FIG. 3, configured in a manner suitable for the footprint of the semiconductor device shown in FIG. 8, in accordance with other aspects of the present invention.

As shown, a MOSFET die 800 includes a gate 800", a source 800', and a drain 800'". A first lead frame 820 has a first terminal 820' and a second terminal 820". First terminal 820' is connected to source 800' through a solder 810. A second lead frame 840 also has a first terminal 840' and a second terminal 840". First terminal 840' is connected to gate 800" through a silver paste 890. An electrically isolating, thermally conducting interlayer material 208 is coated or otherwise applied to drain 800'" through a solder 850. A packaging material 880 is used to encapsulate die 800, first terminals 820' and 840' of first and second lead frames 820 and 840, respectively, silver paste 890, solder 810, 830, and 850, and interlayer material 208.

Figure 9:
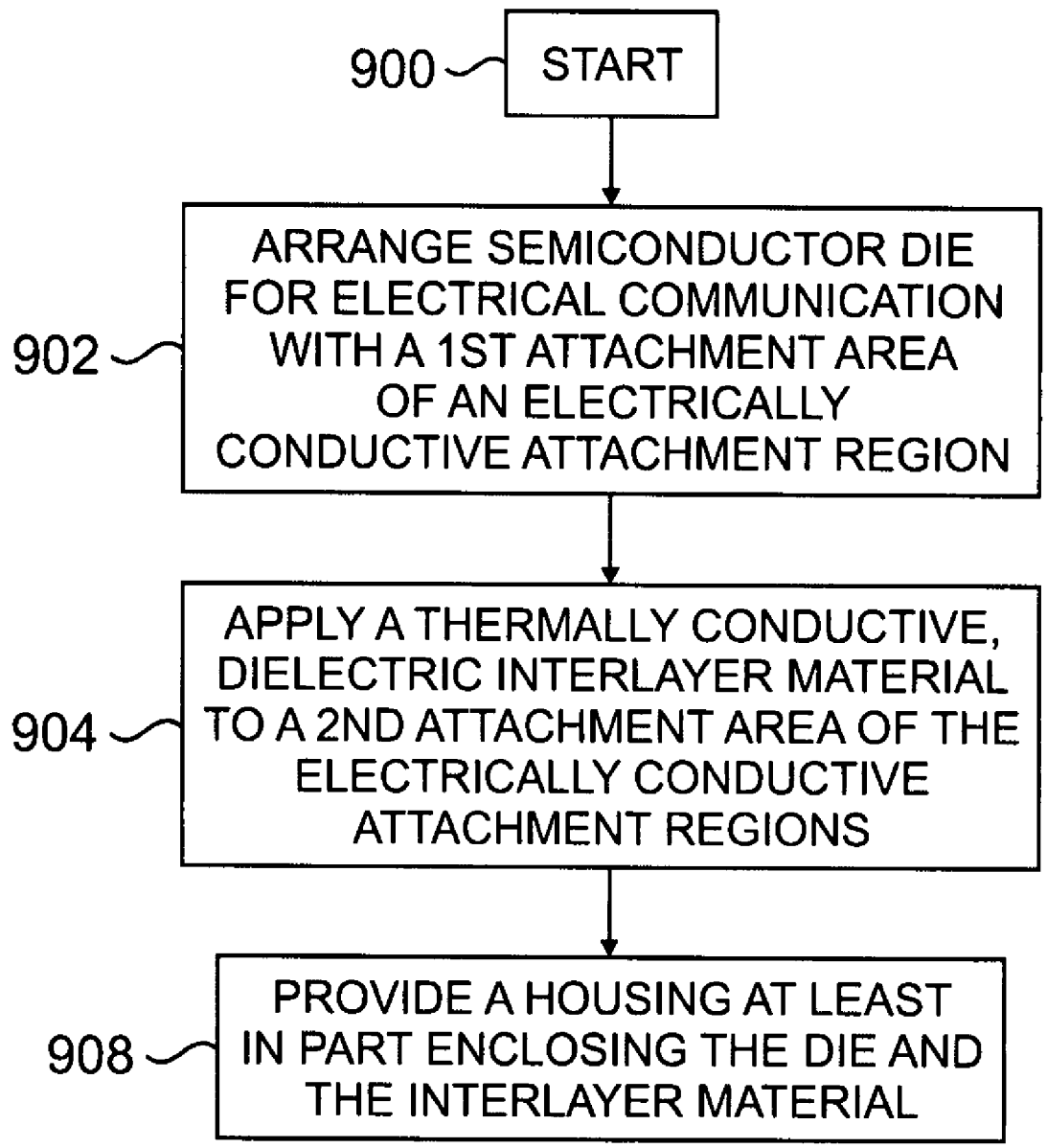
FIG. 9 is a flowchart of a method for fabricating a semiconductor device in accordance with aspects of the present invention.

FIG. 9 is a flowchart of a method for manufacturing a semiconductor device, such as the semiconductor device 200 shown in FIG. 3 or the semiconductor device 800 shown in FIG. 8, in accordance with aspects of the present invention. The method begins at block 900, and continues at block 902, where a semiconductor die is arranged for electrical communication with a first attachment area of an electrically conductive attachment region, such as a copper pad, a lead frame, or a terminal thereof.

Next, at block 904, a thermally conductive, dielectric interlayer material is applied to a second attachment area of the electrically conductive attachment region. The interlayer material may be coated onto the second attachment area using, for instance, a screen printing process.

At block 908, a housing, which may be composed of a material such as plastic, is provided that at least in part encloses the die and the interlayer material and the electrically conductive attachment region. The housing is affixed (by molding, for example) in such a manner that exterior packaging of the semiconductor device is provided by the housing. The thickness of the housing extending from the electrically conductive attachment region may be less than would otherwise be possible while still avoiding problems (e.g. electrical insulation breakdowns) caused by voids and the like if the interlayer material were not employed.

It will be apparent that other and further forms of the aspects of the present invention described herein may be devised without departing from the spirit and scope of the appended claims, and it will be understood that aspects of this invention are not to be limited to the specific embodiments described above.

The invention claimed is:

1. A semiconductor device mountable to a substrate, comprising:
   a semiconductor die;
   an electrically conductive attachment region, in electrical communication with through-hole mountable leads and on a same horizontal plane as said through-hole mountable leads, said attachment region having a first attachment surface and a second attachment surface, said first attachment surface parallel and opposite to said second attachment surface, the first attachment surface arranged for electrical communication with the semiconductor die, wherein the electrically conductive attachment region comprises one of a copper pad, a solder ball, a lead, a lead frame, and a lead frame terminal;
   an interlayer material formed on the second attachment surface of the electrically conductive attachment region, said interlayer material being a thermally conductive, dielectric material; and
   a housing at least in part enclosing the semiconductor die and the interlayer material.

2. The semiconductor device according to claim 1, wherein the semiconductor device comprises a power semiconductor device.

3. The semiconductor device according to claim 2, wherein the power semiconductor device comprises a rectifier.

4. The semiconductor device according to claim 3, wherein the rectifier comprises a bridge rectifier.

5. The semiconductor device according to claim 1, wherein the semiconductor device comprises a surface-mountable device.

6. The semiconductor device according to claim 1, wherein the semiconductor device comprises a through-hole-mountable device.

7. The semiconductor device according to claim 1, wherein the semiconductor device comprises an integrated circuit.

8. The semiconductor device according to claim 7, wherein the integrated circuit comprises a chip-scale package.

9. The semiconductor device according to claim 1, wherein the interlayer material comprises a screen printed layer.

10. The semiconductor device according to claim 1, wherein the housing comprises a molding compound.

11. A semiconductor device mountable to a substrate, comprising:
    a semiconductor die;

an electrically conductive attachment region, in electrical communication with through-hole mountable leads and on a same horizontal plane as said through-hole mountable leads, said attachment region having a first attachment surface and a second attachment surface, said first attachment surface parallel and opposite to said second attachment surface, the first attachment surface arranged for electrical communication with the semiconductor die;

an interlayer material formed on the second attachment surface of the electrically conductive attachment region, said interlayer material being a thermally conductive, dielectric material; and a housing at least in part enclosing the semiconductor die and the interlayer material, wherein the interlayer material is a thermally conductive adhesive.

12. A method of manufacturing a semiconductor device mountable to a substrate, the method comprising:

arranging a semiconductor die for electrical communication with a first attachment area of an electrically conductive attachment region, said electrically conductive attachment region in electrical communication with through-hole mountable leads and on a same horizontal plane as said through-hole mountable leads, wherein the electrically conductive attachment region comprises one of a copper pad, a solder ball, a lead, a lead frame, and a lead frame terminal;

applying a dielectric, thermally conductive interlayer material to a second attachment area of the electrically conductive attachment region, said first attachment area parallel and opposite to said second attachment area;

providing a housing at least in part enclosing the die and the interlayer material.

13. The method of manufacturing the semiconductor device according to claim 12, further comprising:

molding the housing to form an exterior packaging of the semiconductor device.

14. The method of claim 12 wherein the interlayer material is a thermally conductive.

15. A method of manufacturing a semiconductor device mountable to a substrate, the method comprising:

arranging a semiconductor die for electrical communication with a first attachment area of an electrically conductive attachment region, said electrically conductive attachment region in electrical communication with through-hole mountable leads and on a same horizontal plane as said through-hole mountable leads;

applying a dielectric, thermally conductive interlayer material to a second attachment area of the electrically conductive attachment region, said first attachment area parallel and opposite to said second attachment area, wherein the interlayer material is applied by a screen printing process; and providing a housing at least in part enclosing the die and the interlayer material.

16. The method of claim 12 wherein the semiconductor device comprises a surface mountable device.

17. The method of claim 12 wherein the semiconductor device comprises a through hole-mountable device.

18. The method of claim 12, wherein the semiconductor device comprises a power semiconductor device.

* * * * *